(12) United States Patent
Lin et al.

(10) Patent No.: US 11,832,490 B2
(45) Date of Patent: Nov. 28, 2023

(54) ELECTRONIC DEVICE

(71) Applicant: InnoLux Corporation, Miao-Li County (TW)

(72) Inventors: Hsiao-Lang Lin, Miao-Li County (TW); Tsung-Han Tsai, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 18/113,053

(22) Filed: Feb. 23, 2023

(65) Prior Publication Data

US 2023/0200170 A1 Jun. 22, 2023

Related U.S. Application Data

(63) Continuation of application No. 17/216,599, filed on Mar. 29, 2021, now Pat. No. 11,610,945, which is a continuation of application No. 16/788,258, filed on Feb. 11, 2020, now Pat. No. 10,991,766, which is a continuation of application No. 16/129,794, filed on Sep. 13, 2018, now Pat. No. 10,600,846.

(51) Int. Cl.
*H10K 59/35* (2023.01)
*H10K 59/32* (2023.01)
*H10K 59/38* (2023.01)

(52) U.S. Cl.
CPC ............. *H10K 59/35* (2023.02); *H10K 59/32* (2023.02); *H10K 59/38* (2023.02)

(58) Field of Classification Search
CPC ........ H10K 59/35; H10K 59/32; H10K 59/38; H10K 2102/331; H10K 59/10; H01L 27/156; H01L 33/502; H01L 33/504
See application file for complete search history.

(56) References Cited

U.S. PATENT DOCUMENTS

| | | | | |
|---|---|---|---|---|
| 9,612,476 B2 * | 4/2017 | Qiu | ...................... | G02B 6/0073 |
| 2006/0132679 A1 * | 6/2006 | Sui | ................... | G02F 1/133514 |
| | | | | 349/106 |

\* cited by examiner

*Primary Examiner* — Yasser A Abdelaziez
(74) *Attorney, Agent, or Firm* — Winston Hsu

(57) ABSTRACT

An electronic device includes a first electronic unit and a second electronic unit. The first electronic unit emits a blue light having a first spectrum, the first spectrum has a first intensity, and the first intensity is a maximum intensity of the first spectrum. The second electronic unit emits a light having a second spectrum different from the first spectrum, the second spectrum has a second intensity in a range from 300 nm to 460 nm, and the second intensity is a maximum intensity in the range from 300 nm to 460 nm of the second spectrum. The first intensity is greater than the second intensity.

20 Claims, 10 Drawing Sheets

ELECTRONIC DEVICE

CROSS REFERENCE TO RELATED APPLICATIONS

This application is a continuation application of U.S. application Ser. No. 17/216,599, filed on Mar. 29, 2021, which is a continuation application of U.S. application Ser. No. 16/788,258, filed on Feb. 11, 2020, which is a continuation application of U.S. application Ser. No. 16/129,794, filed on Sep. 13, 2018. The contents of these applications are incorporated herein by reference.

BACKGROUND OF THE DISCLOSURE

1. Field of the Disclosure

The present disclosure relates to an electronic device, and more particularly to an electronic device including light conversion layer.

2. Description of the Prior Art

The display device can be integrated in the electronic device. The color gamut is referenced to NTSC (National Television System Committee) color gamut. Rec. 2020 color gamut is one of the color gamuts applied to the electronic devices (such as display devices). In order to increase the display performance, it is an issue for manufacturers to provide more pure colors (e.g. red, green, or blue) of lights for meeting the requirement of Rec. 2020 in high color gamut application.

SUMMARY OF THE DISCLOSURE

In some embodiments, an electronic device includes a first electronic unit and a second electronic unit. The first electronic unit emits a blue light having a first spectrum, the first spectrum has a first intensity, and the first intensity is a maximum intensity of the first spectrum. The second electronic unit emits a light having a second spectrum different from the first spectrum, the second spectrum has a second intensity in a range from 300 nm to 460 nm, and the second intensity is a maximum intensity in the range from 300 nm to 460 nm of the second spectrum. The first intensity is greater than the second intensity.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. For purposes of illustrative clarity understood, various drawings of this disclosure show a portion of the electronic device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to".

When an element or layer is referred to as being "on" or "connected to" another element or layer, it can be directly on or directly connected to the other element or layer, or intervening elements or layers may be presented. In contrast, when an element is referred to as being "directly on" or "directly connected to" another element or layer, there are no intervening elements or layers presented.

The terms "about", "substantially", "equal", or "same" generally mean within 20% of a given value or range, or mean within 10%, 5%, 3%, 2%, 1%, or 0.5% of a given value or range.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

The technical features in different embodiments described in the following can be replaced, recombined, or mixed with one another to constitute another embodiment without departing from the spirit of the present disclosure.

Figure 1:
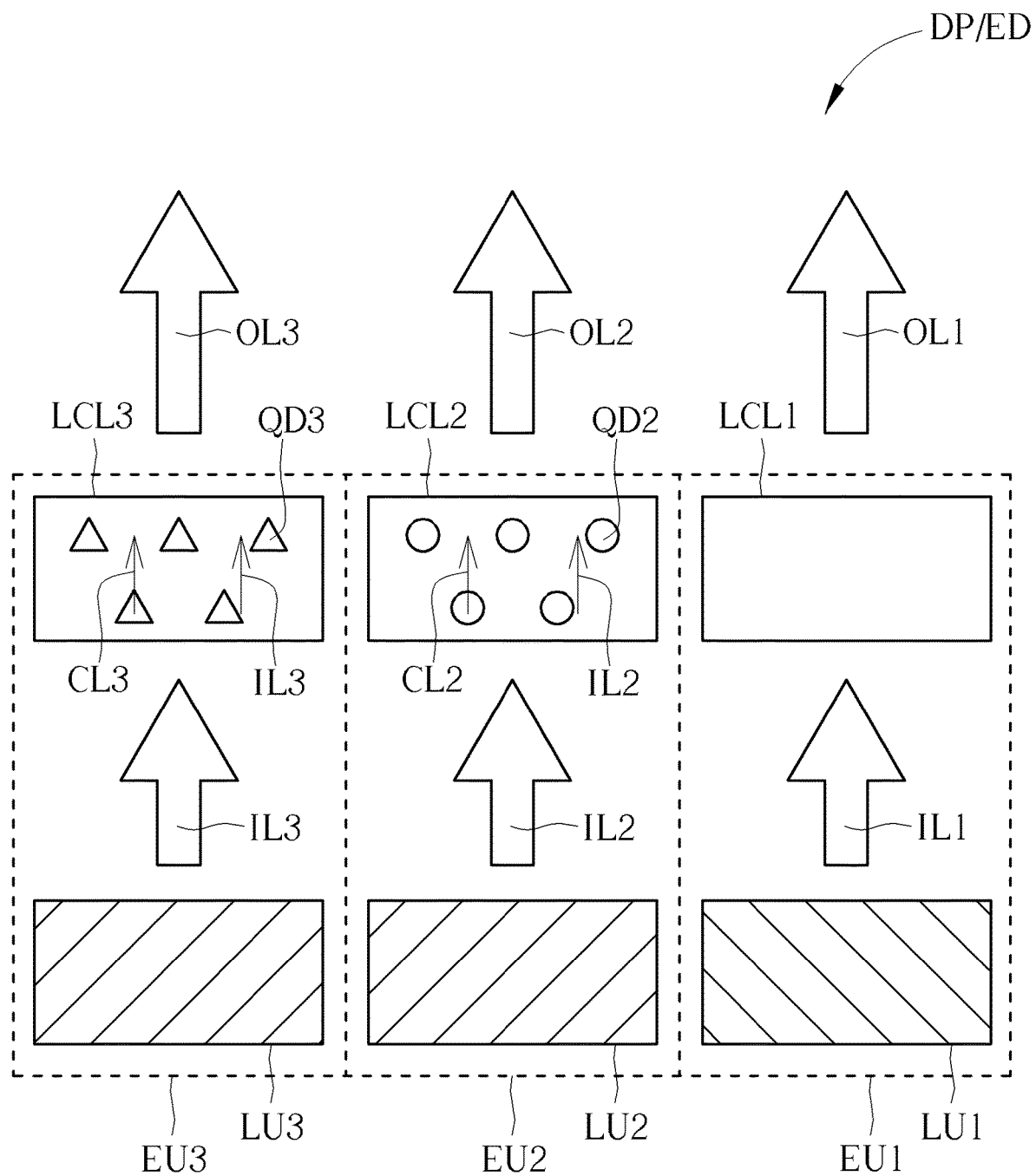
FIG. 1 is a schematic diagram illustrating an electronic device according to a first embodiment of the present disclosure.
Figure 2:
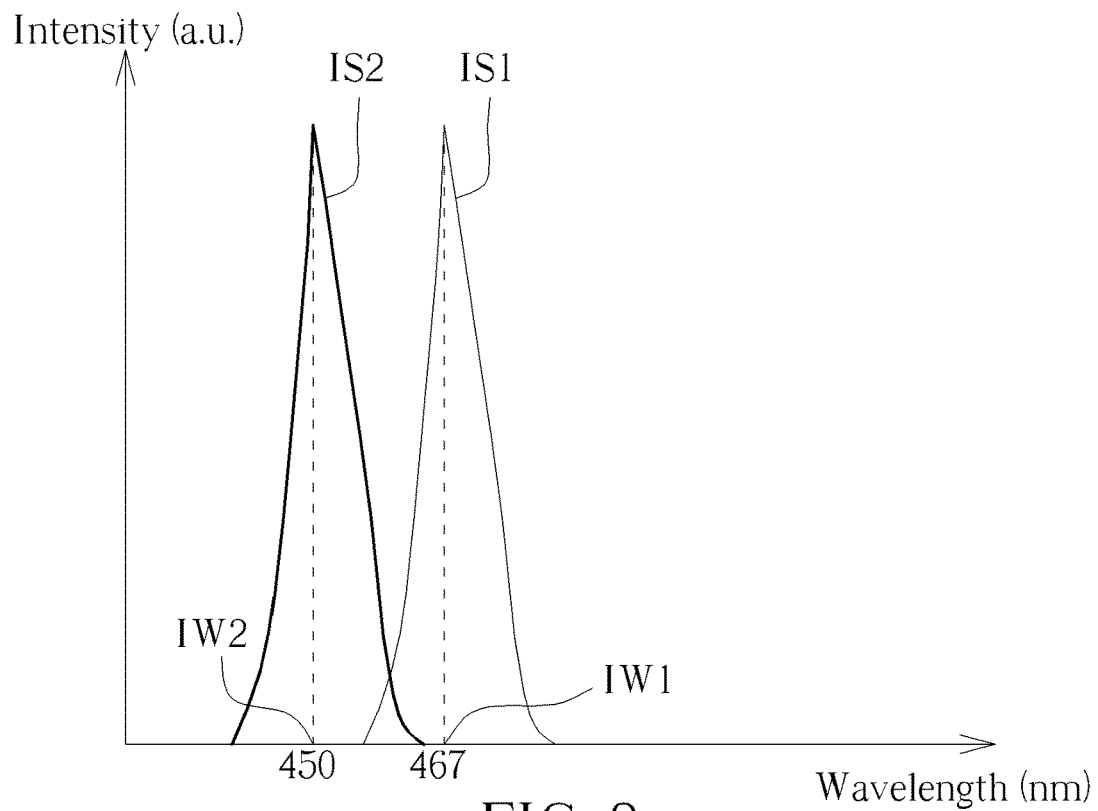
FIG. 2 is a schematic diagram illustrating the input spectrum of the input lights of the first embodiment.
Figure 3:
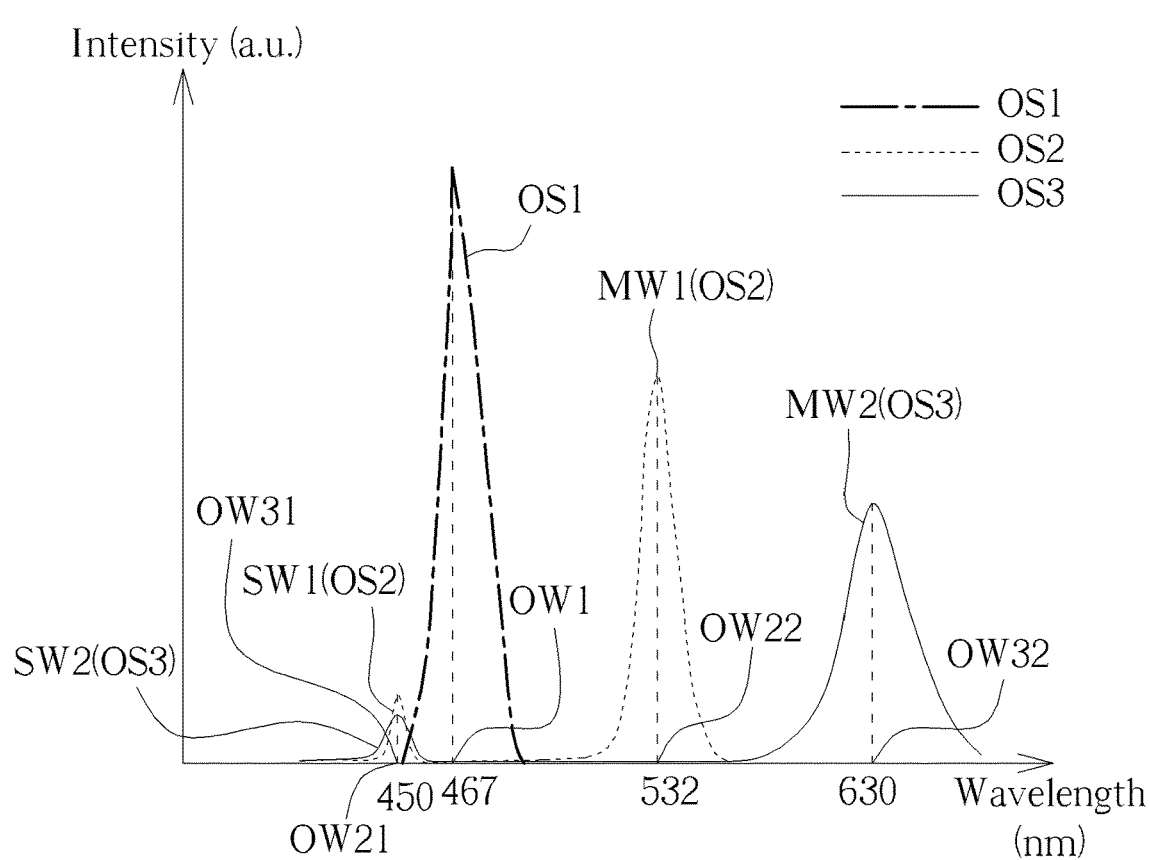
FIG. 3 is a schematic diagram illustrating the output spectrum of the output light of the first embodiment.

FIG. 1 is a schematic diagram illustrating an electronic device according to a first embodiment, FIG. 2 is a schematic diagram illustrating the input spectrum of the input lights of the first embodiment, and FIG. 3 is a schematic diagram illustrating the output spectrum of the output light of the first embodiment. The electronic device ED can be a display device DP, sensing device, lighting device, but it is not limited thereto. The electronic device ED can include a first electronic unit EU1 (includes a first light emitting element LU1 and a first light conversion layer LCL1), a second electronic unit EU2 (includes a second light emitting element LU2 and a second light conversion layer LCL2), and a third electronic unit EU3 (includes a third light emitting element LU3 and a third light conversion layer LCL3). In one embodiment, the first light emitting element LU1, the second light emitting element LU2, or the third light emitting element LU3 includes organic light emitting diodes (OLED), light emitting diodes (LED), mini-LED, micro-LED, quantum dots (QDs), quantum dots LEDs (QLEDs or QD-LEDs), fluorescent materials, phosphorescent materials, other suitable materials or combination thereof, but it is not limited thereto. In some embodiments, the light emitting layer may include multiple quantum well (MQW). In some embodiments, the electronic device may be a liquid crystal display (LCD) device, and the above light emitting elements may be a backlight, but it is not limited thereto.

The first light conversion layer LCL1 can be disposed on the first light emitting element LU1, the second light conversion layer LCL2 can be disposed on the second light emitting element LU2, and the third light conversion layer LCL3 can be disposed on the third light emitting element LU3. In some embodiments, the first light conversion layer LCL1, the second light conversion layer LCL2, or the third light conversion layer LCL3 can include a plurality of quantum dots, a fluorescent material, a phosphorescent material, a color filter layer, or the combination thereof, but not limited to this. The quantum dots may be made of a semiconductor nano-crystal structure, and can include CdSe, CdS, CdTe, ZnSe, ZnTe, ZnS, HgTe, InAs, $Cd_{1-x}Zn_xSe_{1-y}S_y$, CdSe/ZnS, InP, and GaAs, but not limited thereto. Quantum dots generally have a particle size between 1 nm and 30 nm, 1 nm and 20 nm, or 1 nm and 10 nm. When quantum dots are excited by an input light, the input light will be converted into an emitted light with other colors by quantum dots. The color of the emitted light may be adjusted by the material or size of the quantum dots. In other embodiments, the quantum dots may include sphere particles, rod particles or particles with any other suitable shapes as long as the quantum dots could emit light with suitable color. In one embodiment, the first light conversion layer LCL1 may be replaced by a transparent layer, which has no quantum dots therein. The transparent layer may include transparent dielectric material, but not limited to this. In some embodiment, the first light conversion layer LCL1 does not include in the first electronic unit EU1.

The first light emitting element LU1 can emit a third light IL1 having a third spectrum IS1 shown in FIG. 2. The third light IL1 can be an input light of the first light conversion layer LCL1. A main peak of the third spectrum IS1 corresponds to a third wavelength IW1, and the third wavelength IW1 may be in a range from 461 nm (nanometer) to 473 nm, for example, the third wavelength IW1 is about 467 nm in FIG. 2. The third light IL1 may be a blue light. As shown in FIG. 1 and FIG. 3, the first electronic unit EU1 can emit a first light OL1 having a first spectrum OS1, and a main peak of the first spectrum OS1 corresponds to a first wavelength OW1 ranged from 461 nm to 473 nm. The first light OL1 can be an output light (such as blue light) emitted from the first electronic unit EU1. Detailed relationship about the third light IL1 and the first light OL1 will be explained later. Since the first light conversion layer LCL1 is replaced by a transparent layer, or removed from the first electronic unit EU1, the third light IL1 and the first light OL1 can have the same spectrum, thus the first wavelength OW1 can be in the range from 461 nm to 473 nm, for example the first wavelength OW1 is about 467 nm in FIG. 3.

The second light emitting element LU2 can emit an fourth light IL2 and the third light emitting element LU3 can emit a fifth light IL3. The fourth light IL2 can be an input light of the second light conversion layer LCL2. The fifth light IL3 can be an input light of the third light conversion layer LCL3. The fourth light IL2 has the fourth spectrum IS2 shown in FIG. 2, and the fifth light IL3 has a fifth spectrum (not shown) that is the same as the fourth spectrum IS2. A main peak of the fourth spectrum IS2 corresponds to a fourth wavelength IW2 may be in a range from 300 nm to 460 nm. In one embodiment, the fourth wavelength IW2 is in a range from 440 nm to 460 nm (such as about 450 nm in FIG. 2). In one embodiment, the third wavelength IW1 is different from the fourth wavelength IW2. In one embodiment, the third wavelength IW1 is greater than the fourth wavelength IW2. In some embodiment, the second light emitting element LU2 and the third light emitting element LU3 may include the same type of light emitting elements or include the same light emitting materials, but the type of light emitting element or the light emitting material of the first light emitting element LU1 may be different from the second light emitting element LU2 and/or the third light emitting element LU3. In the present disclosure, the above output lights could be regarded as the final visual light of the electronic device ED perceived by the user (observer).

In the second electronic unit EU2, the fourth light IL2 can be converted into a second light OL2 (with second spectrum OS2 shown in FIG. 3). The second light conversion layer LCL2 may include quantum dots QD2, the quantum dots QD2 can be excited by a portion of the fourth light IL2, and the portion of the fourth light IL2 may be converted into a light CL2 by the quantum dots QD2 shown in FIG. 1. Because the conversion efficiency of quantum dots QD2 is not 100%, so another portion of the fourth light IL2 may not be converted into the light CL2, and the second light OL2 may be the mixture of the light CL2 and another portion of the fourth light IL2. The second light OL2 may be an output light emitted from the second electronic unit EU2.

As shown in FIG. 3, the second spectrum OS2 is different from the first spectrum OS1. The second spectrum OS2 may include a main wave MW1 and a sub-wave SW1. The sub-wave SW1 may represent the unconverted fourth light IL2. A sub peak of the sub-wave SW1 of the second spectrum OS2 corresponds to a second wavelength OW21 in the range from 300 nm to 460 nm. "Sub peak of the sub-wave SW1" is defined as a crest of the sub-wave SW1. Similarly, sub peaks of other sub-waves in the spectrum may also be defined by the above way in this disclosure. In one embodiment, the second wavelength OW21 is in the range from 440 nm to 460 nm (such as about 450 nm in FIG. 3). The difference between the first wavelength OW1 and the second wavelength OW21 is greater than or equal to 5 nm and less than or equal to 167 nm (such as about 17 nm as shown in FIG. 3), and the first wavelength OW1 is greater than the second wavelength OW21. A ratio of an intensity of the sub peak of the second spectrum OS2 to an intensity of the main peak of the first spectrum OS1 may be in a range from 0.06% to 10.0% (such as 0.64% to 9.6%).

The main wave MW1 of the second spectrum OS2 may represent the light CL2 converted by the second light conversion layer LCL2. A main peak of the main wave MW1 of the second spectrum OS2 corresponds to a wavelength OW22, and the wavelength OW22 may be in a range from 522 nm to 542 nm, such as 532 nm in FIG. 3. "Main peak of the main wave MW1" is defined as a crest of the main wave MW1. Similarly, main peaks of other main waves may also be defined by the above way in this disclosure. In some embodiments, a relatively large portion of the fourth light IL2 may be converted by the second light conversion layer LCL2, the intensity of the main peak of the main wave MW1 of the second spectrum OS2 is greater than the intensity of the sub peak of the sub-wave SW1 of the second spectrum OS2.

The concept or method of light conversion in the third electronic unit EU3 is similar to the second electronic unit EU2. The third electronic unit EU3 emits a sixth light OL3 having a sixth spectrum OS3 different from the first spectrum OS1, and a sub peak of the sixth spectrum OS3 corresponds to a wavelength OW31 ranged from 300 nm to 460 nm, and a difference between the first wavelength OW1 and the wavelength OW31 is greater than or equal to 5 nm.

The sixth light OL3 can be an output light emitted from the third electronic unit EU3. The third light conversion layer LCL3 may include quantum dots QD3, and quantum dots QD3 can be excited by a portion of the fifth light IL3, and the portion of the fifth light IL3 may be converted into a light CL3 with a color different from the color of the fifth light IL3 by quantum dots QD3. The light CL3 and the unconverted fifth light IL3 can be mixed with each other to form the sixth light OL3.

As shown in FIG. 3, the sixth spectrum OS3 may include a main wave MW2 and a sub-wave SW2. The sub-wave SW2 may represent the unconverted fifth light IL3. A sub peak of the sub-wave SW2 of the sixth spectrum OS3 corresponds to a wavelength OW31 in the range from 300 nm to 460 nm. In one embodiment, the wavelength OW31 is in the range from 440 nm to 460 nm (such as 450 nm in FIG. 3), and the second wavelength OW21 and the wavelength OW31 may be approximately the same, the difference between the second wavelength OW21 and the wavelength OW31 may be less than or equal to 2 nm. The sixth spectrum OS3 of the sixth light OL3 is different from the first spectrum OS1 and the second spectrum OS2.

The difference between the first wavelength OW1 and the wavelength OW31 (or the wavelength OW21) is about 17 nm as shown in FIG. 3. The ratio of the intensity of the sub peak of the sixth spectrum OS3 to the intensity of the main peak of the first spectrum OS1 may be in the range from 0.06% to 10.0% (such as 0.064% to 0.96%).

In another aspect, the main wave MW2 may represent the light CL3 being converted from the third light conversion layer LCL3. A main peak of the main wave MW2 of the sixth spectrum OS3 corresponds to a sixth wavelength OW32, and the sixth wavelength OW32 may be in a range from 620 nm to 640 nm (such as 630 nm in FIG. 3). In addition, since a portion of the fifth light IL3 may be converted by the third light conversion layer LCL3, the intensity of the main peak of the sixth spectrum OS3 is greater than the intensity of the sub peak of the sixth spectrum OS3.

In some embodiments, the first light OL1 may be a blue light, the second light OL2 may be a green light, and the sixth light OL3 may be a red light. In some embodiments, the electronic device including other electronic units emitting a light with a color different from the first light OL1, the second light OL2 and the sixth light OL3.

The spectrums (such as the first spectrum OS1, second spectrum OS2, or sixth spectrum OS3) may be measured by an apparatus capable of detecting chromaticity, such as the photo detector, color analyzer CA-210, CS 1000T, CS 2000, but not limited to this. The spectrums (such as first spectrum OS1, second spectrum OS2, or sixth spectrum OS3) may be separately measured from corresponding electronic units, and at least one of the corresponding electronic units can be turned on during the measurement, and the electronic device is not dismantled.

In addition, the spectrums (such as the third spectrum IS1 or fourth spectrum IS2) may be measured by PL (photoluminescence) measurement system. The spectrums (such as the third spectrum IS1 or fourth spectrum IS2) may be measured from a surface of the light emitting element. For example, the light emitting elements and light conversion layers may be separated, and the lights emitted from the first light emitting element LU1, the second light emitting element LU2, or the third light emitting element LU3 could be measured by the PL measurement system. In some embodiments, these spectrums (such as the first spectrum OS1, second spectrum OS2, sixth spectrum OS3, third spectrum IS1 or fourth spectrum IS2) can be measured by other suitable methods or instruments.

In some electronic devices, the light sources (such as light emitting elements) of different electronic units are the same type or produce the same spectrum, and the main peaks of the spectrums of the blue lights emitted from the light emitting elements have the same wavelength at about 450 nm. For example, the x chromaticity coordinate ($B_x$) of the blue light having the wavelength of 455 nm is about 0.143, $B_X$ of the blue light having the wavelength of 460 nm is about 0.141, and $B_X$ of the blue primary color of the Rec. 2020 is about 0.131. Accordingly, the difference between $B_X$ (referring to as "$\Delta B_x$") of the blue light emitted from the blue pixel and $B_X$ of the blue primary color of the Rec. 2020 is greater than or equal to 0.01. However, according to the present disclosure, the first light emitting element LU1 is different from the second light emitting element LU2 and the third light emitting element LU3, and the main peak of the spectrum of the blue light emitted from the first electronic unit EU1 representing blue pixel has a wavelength at about 467 nm. For example, $B_X$ of the blue light having the wavelength of 467 nm is about 0.131, and $B_X$ of the blue light having the wavelength of 461 nm is about 0.134, $\Delta B_x$ can be less than 0.004, the blue light emitted from the first electronic unit EU1 can be closer to the blue primary color of the Rec. 2020 in high color gamut application.

The technical features in different embodiments described can be replaced, recombined, or mixed. For making it easier to compare the difference between the embodiments and variant embodiments, the following description will detail the dissimilarities among different variant embodiments or embodiments and the identical features will not be redundantly described.

Table 1 illustrates different modifications of the first electronic unit EU1, the second electronic unit EU2, and the third electronic unit EU3. These variant embodiments can be understood by referring to FIGS. 1-3 and the following descriptions. In the present disclosure, the first electronic unit EU1 may adopt any modification from the variant embodiments B1-B5, the second electronic unit EU2 (and/or the third electronic unit EU3) may adopt any modification from the variant embodiments A1-A5. The first electronic unit EU1 adopting any modification from the variant embodiments B1-B5 can obtain a spectrum similar to the first spectrum OS1. The second electronic unit EU2 (and/or the third electronic unit EU3) adopting any modification from the variant embodiments A1-A5 can obtain a spectrum similar to the second spectrum OS2 (and/or the sixth spectrum OS3).

TABLE 1

| Variant embodiment of the second electronic unit and/or the third electronic unit | Variant embodiment of the first electronic unit |
| --- | --- |
| A1 | B1 |
| A2 | B2 |
| A3 | B3 |
| A4 | B4 |
| A5 | B5 |

In the variant embodiment A1, the fourth light IL2 emitted by the second light emitting element LU2 has a fourth spectrum IS2, and the main peak of this spectrum corresponds to a wavelength in the range from 440 nm to 460 nm. In the variant embodiment A1, the fifth light IL3 emitted by the third light emitting element LU3 has a spectrum, and the main peak of this spectrum corresponds to a wavelength in the range from 440 nm to 460 nm.

In the variant embodiment A2, the fourth light IL2 emitted by the second light emitting element LU2 may have a fourth spectrum IS2, and the main peak of the fourth spectrum IS2 corresponds to a wavelength in the range from 461 nm to 473 nm. In the variant embodiment A2, the fifth light IL3 emitted by the third light emitting element LU3 may have a spectrum, and the main peak of the spectrum corresponds to a wavelength in the range from 461 nm to 473 nm.

In the variant embodiment A3, the second light emitting element LU2 (and/or the third light emitting element LU3) emits UV light. The wavelength of the main peak of the spectrum of UV light corresponds to a wavelength in the range from 300 nm to 450 nm. In some embodiment (embodiment A3), the second light conversion layer LCL2 (and/or the third light conversion layer LCL3) may include the quantum dots for converting a portion of UV light into red light (and/or green light) and remaining a portion of UV light. In some embodiments (embodiment A3), the second light conversion layer LCL2 (and/or the third light conversion layer LCL3) may include two kinds of quantum dots for producing a portion of red light (and/or green light) and a portion of blue light (e.g. in the range from 440 nm to 460 nm). When the second light emitting element LU2 (and/or the third light emitting element LU3) emits small amount of blue light can reduce the sensitivity of the human eye to yellow light, but not limited to this.

In the variant embodiment A4, the second light emitting element LU2 (or the third light emitting element LU3) can emit a mixed light. The mixed light is formed by mixing a blue light having the main peak in the range from 461 nm to 473 nm and another blue light having the main peak in the range from 440 nm to 460 nm. For example, the light emitting element can include two light emitting components (such as light emitting layers), one of them can emit the blue light having the main peak at about 450 nm, and another one can emit the blue light having the main peak at about 467 nm. These light emitting components may be stacked vertically or disposed horizontally (e.g. side by side) within one electronic unit. In some embodiment, the light emitting element can include a plurality of light emitting components.

In the variant embodiment A5, the second light emitting element LU2 (or the third light emitting element LU3) can include the quantum dots light emitting diode display (QLED) capable of emitting the green light having the main peak at about 532 nm (or the red light having the main peak at about 630 nm). Under embodiment A5, the second light conversion layer LCL2 (and/or the third light conversion layer LCL3) may be not required to be disposed in the second electronic unit EU2 (or/and the third electronic unit EU3). However, in some embodiment, the above QLED can further includes a small amount of the quantum dots for converting a small amount of blue light having a peak at about 450 nm.

In the variant embodiment B1, the main peak of the third spectrum OS1 of third light IL1 is in the range from 440 nm to 460 nm, the first light conversion layer LCL1 is required to be disposed in the first electronic unit EU1 to convert the third light IL1, and the first electronic unit EU1 will emit the first light OL1 having a first spectrum OS1, and a main peak of main wave of the first spectrum OS1 corresponding to the first wavelength OW1 ranged from 461 nm to 473 nm, the first light OL1 of the first electronic unit EU1 can be closer to the blue primary color of the Rec.2020 in high color gamut application.

In the variant embodiment B2, the main peak of the third spectrum OS1 of the third light IL1 is in the range from 461 nm to 473 nm, the first light conversion layer LCL1 may not be required to be disposed in the first electronic unit EU1.

In the variant embodiment B3, the first light emitting element LU1 emits UV light, the first light conversion layer LCL1 is required to be disposed in the first electronic unit EU1 to convert the UV light, and the first electronic unit EU1 will emit the first light OL1 having a first spectrum OS1, and a main peak of main wave of the first spectrum OS1 corresponding to the first wavelength OW1 ranged from 461 nm to 473 nm, the first light OL1 of the first electronic unit EU1 can be closer to the blue primary color of the Rec.2020 in high color gamut application.

In the variant embodiment B4, the first light emitting element LU1 can emit a mixed light. The mixed light is formed by mixing a blue light having the main peak in the range from 461 nm to 473 nm and another blue light having the main peak in the range from 440 nm to 460 nm. In some embodiments (embodiment B4), the light emitting layer in the light emitting element can include a portion of light emitting material (such as OLED or QLED) that emits the blue light having the main peak at about 450 nm and another portion of the light emitting material (such as OLED or QLED) that emits the blue light having the main peak at about 467 nm. In some variant embodiment B4, the first light conversion layer LCL1 is required to be disposed in the first electronic unit EU1 to convert the mixed light, and the first electronic unit EU1 will emit the first light OL1 having a first spectrum OS1, and a main peak of main wave of the first spectrum OS1 corresponding to the first wavelength OW1 ranged from 461 nm to 473 nm, the first light OL1 of the first electronic unit EU1 can be closer to the blue primary color of the Rec.2020 in high color gamut application. In the above embodiment B4, the first light conversion layer LCL1 may include quantum dots QD1 (FIG. 5), which may convert the mixed light into the first light OL1. In above the embodiment B4, the first light conversion layer LCL1 may include blue color filter capable of converting the blue light having the main peak in the range from 440 nm to 460 nm into the blue light having the main peak in the range from 461 nm to 473 nm.

In the variant embodiment B5, the difference between the variant embodiments B5 and B1 is that the first light conversion layer LCL1 includes the blue color filter layer capable of converting the blue light having the main peak in the range from 440 nm to 460 nm into the blue light having the main peak in the range from 461 nm to 473 nm.

Figure 4:
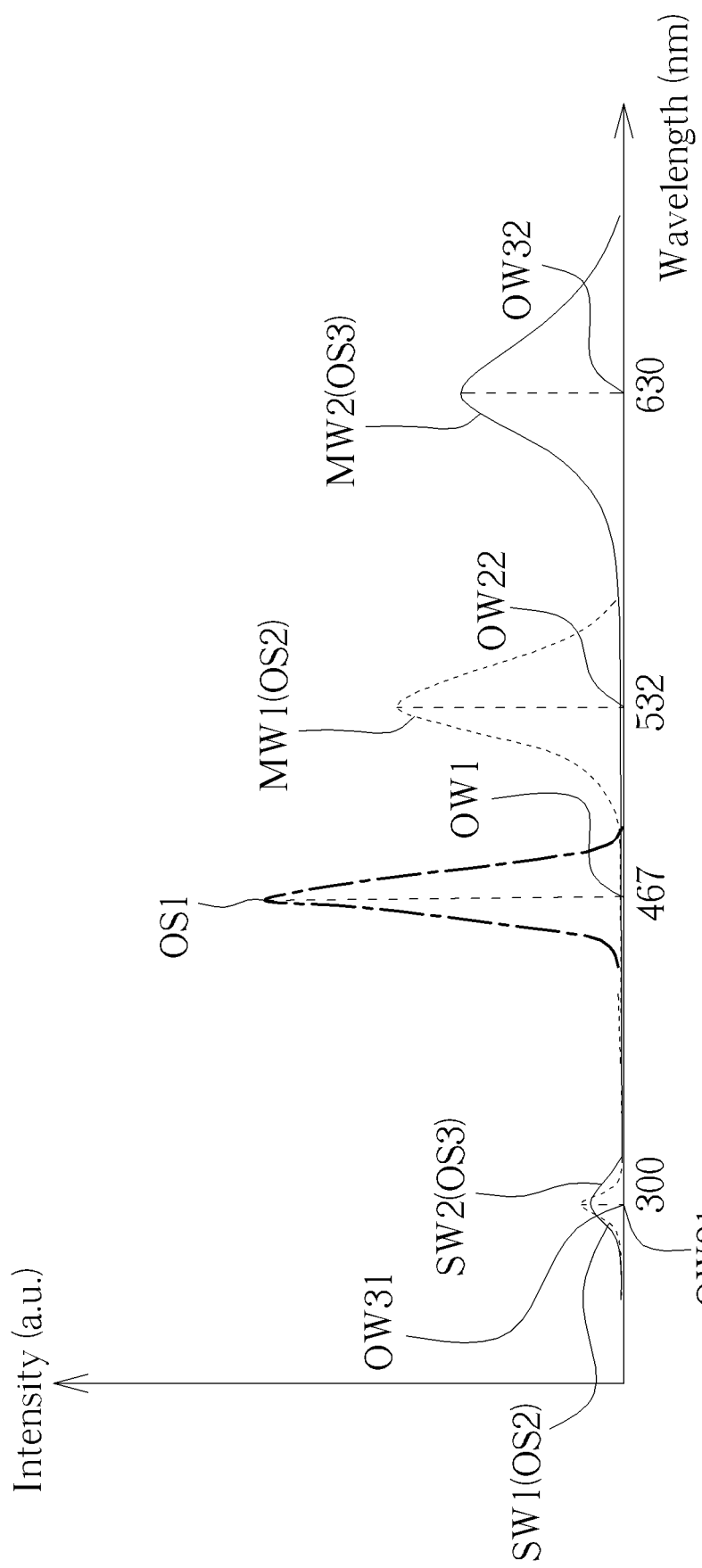
FIG. 4 is a schematic diagram illustrating the output spectrum of the output light of a second embodiment of the present disclosure.

FIG. 4 is a schematic diagram illustrating the output spectrum of the output light of a second embodiment. The second electronic unit EU2 and the third electronic unit EU3 may adopt the concept of the variant embodiment A3, and the first electronic unit EU1 may adopt any structure from the variant embodiments B1-B5. The second light emitting element LU2 and the third light emitting element LU3 may both emit the UV light having the main peak in the range from 300 nm to 450 nm, the wavelengths (such as OW21, OW31) of the sub peaks of the spectrums (such as second spectrum OS2, sixth spectrum OS3) are about 300 nm. The difference between the first wavelength OW1 and the wavelength OW31 (or the second wavelength OW21) is about 167 nm. The difference between the first wavelength OW1 and the second wavelength OW21 is about 167 nm.

Figure 5:
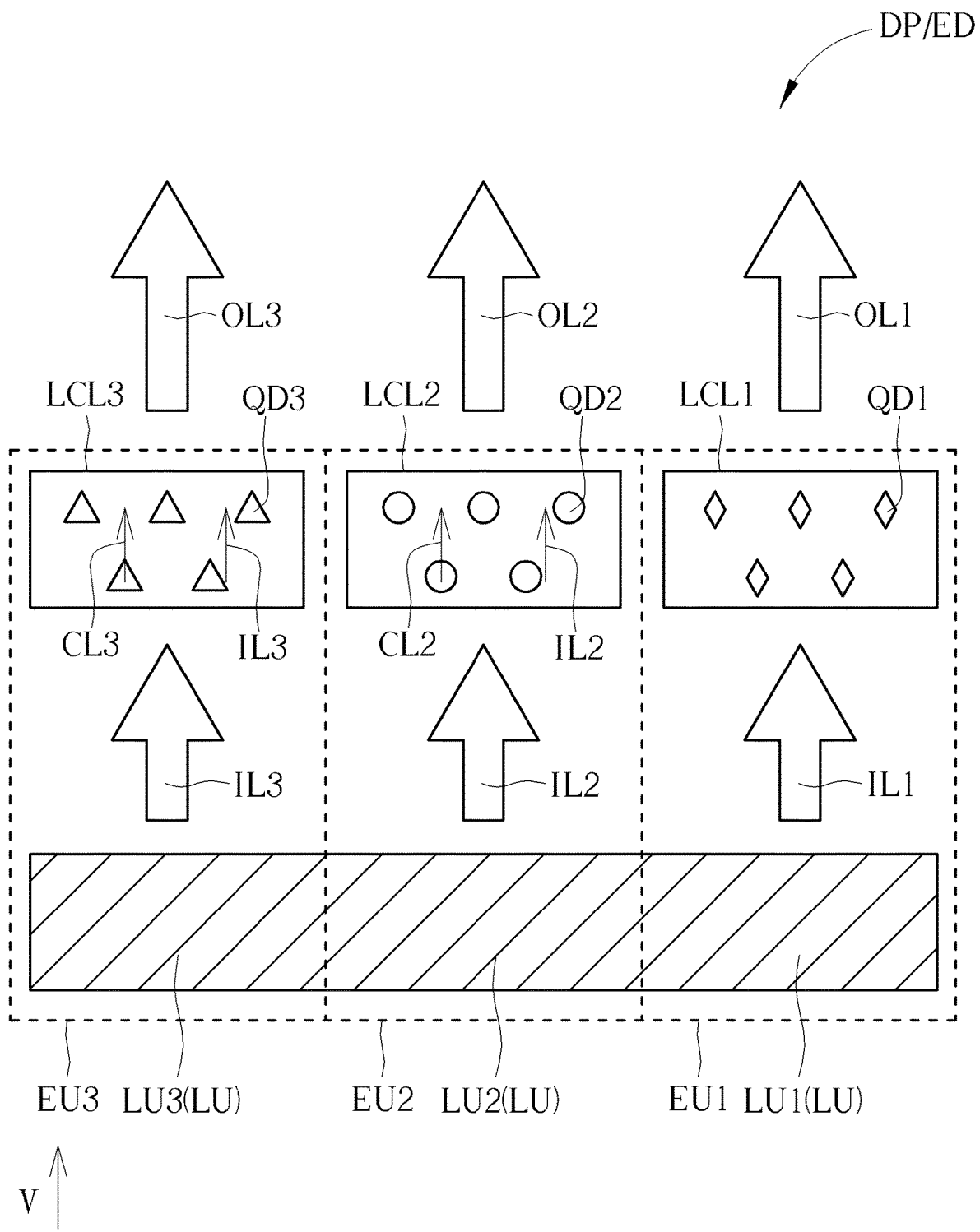
FIG. 5 is a schematic diagram illustrating an electronic device according to a third embodiment of the present disclosure.

FIG. 5 is a schematic diagram illustrating an electronic device according to a third embodiment, the first light emitting element LU1 may contact with the second light emitting element LU2, and the second light emitting element LU2 may contact with the third light emitting element LU3. Therefore, a portion of the common light emitting element LU corresponding to the first light conversion layer LCL1 in a normal direction V may be regarded as the first light emitting element LU1, the normal direction V is perpendicular to the surface of the first light emitting element LU1 (or common light emitting element LU). A portion of the common light emitting element LU corresponding to the second light conversion layer LCL2 in the normal direction V may be regarded as the second light emitting element LU2, and a portion of the common light emitting element LU corresponding to the third light conversion layer LCL3 in the normal direction V may be regarded as the third light emitting element LU3. Accordingly, the third light ILL the fourth light IL2, the fifth light IL3 can have the same spectrum. The third wavelength IW1, the fourth wavelength IW2, and the fifth wavelength can be the same.

In some embodiment (FIG. 5), the common light emitting element LU emits the blue light having the main peak in the range from 440 nm to 460 nm. In some embodiment (FIG. 5), the common light emitting element LU emits the UV light having the main peak in the range from 300 nm to 450 nm. In some embodiment (FIG. 5), the first light conversion layer LCL1 is required to be disposed in the first electronic unit EU1, the first light conversion layer LCL1 can convert the UV light having the main peak into the blue light having the main peak in the range from 461 nm to 473 nm, and the first electronic unit EU1 can be closer to the blue primary color of the Rec. 2020 in high color gamut application. The common light emitting element LU may include organic light emitting diodes (OLEDs), quantum dot light emitting diodes (QLEDs), or the combination thereof, but not limited thereto.

Figure 6:
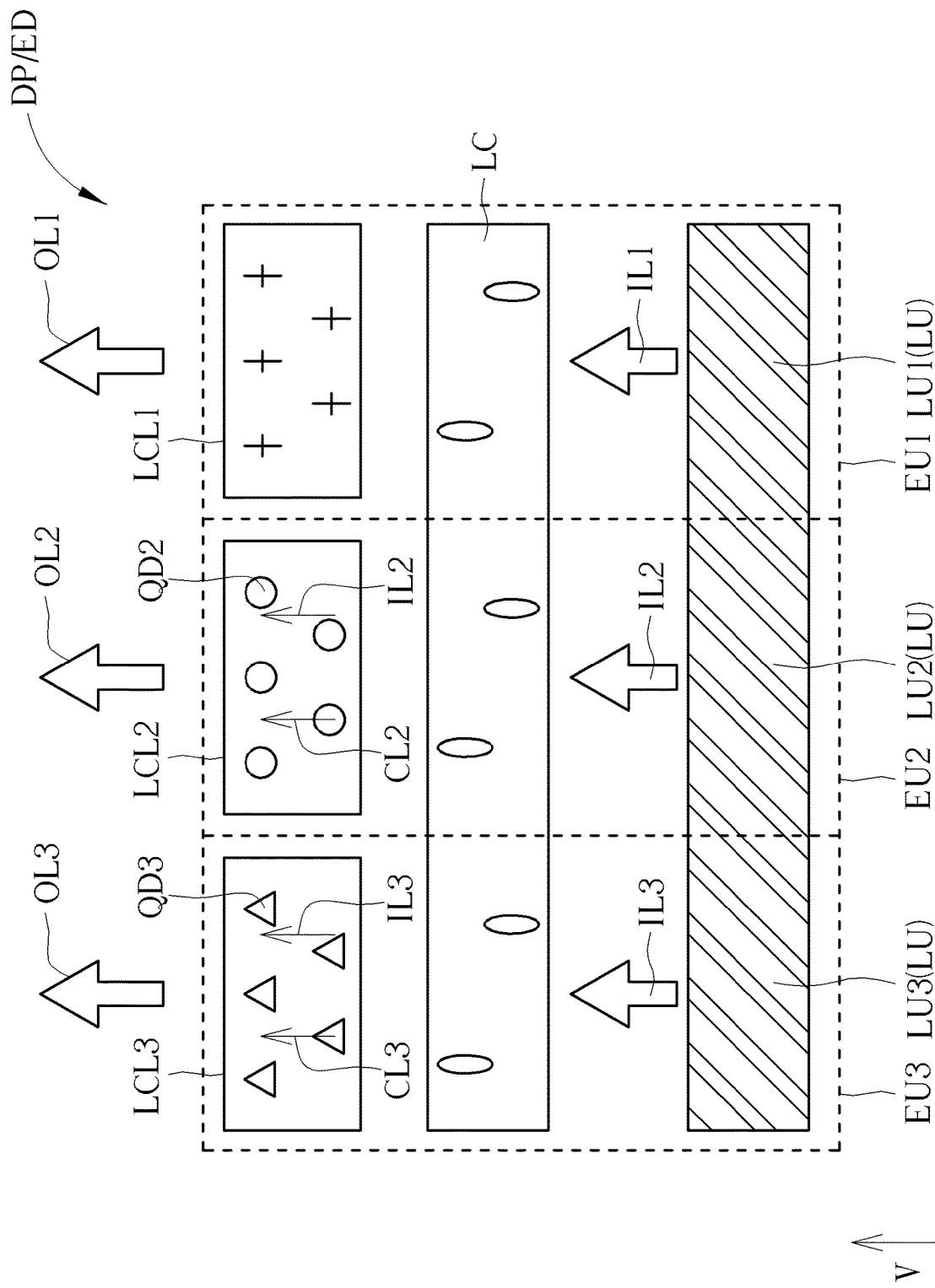
FIG. 6 is a schematic diagram illustrating an electronic device according to a fourth embodiment of the present disclosure.

FIG. 6 is a schematic diagram illustrating an electronic device according to a fourth embodiment. The difference between the fourth embodiment and the third embodiment is that the electronic device ED is a liquid crystal device. In some embodiment, A liquid crystal layer LC is disposed between the common light emitting element LU and the light conversion layers (such as LCL1, LCL2, LCL3), but not limited to this. In some embodiment, the light conversion layers (such as LCL1, LCL2, LCL3) are disposed between a liquid crystal layer LC and the common light emitting element LU. The common light emitting element LU may be a backlight that can emit the blue light having the main peak in the range from 440 nm to 460 nm. In addition, the first light conversion layer LCL1 may include color filter layer or QD that can convert the blue light having the main peak in the range from 440 nm to 460 nm into the blue light having the main peak in the range from 461 nm to 473 nm, and the first electronic unit EU1 can be closer to the blue primary color of the Rec. 2020 in high color gamut application.

In some embodiment, the first light emitting element LU1 or the second light emitting element LU2 comprises one or more light emitting layers.

Figure 7:
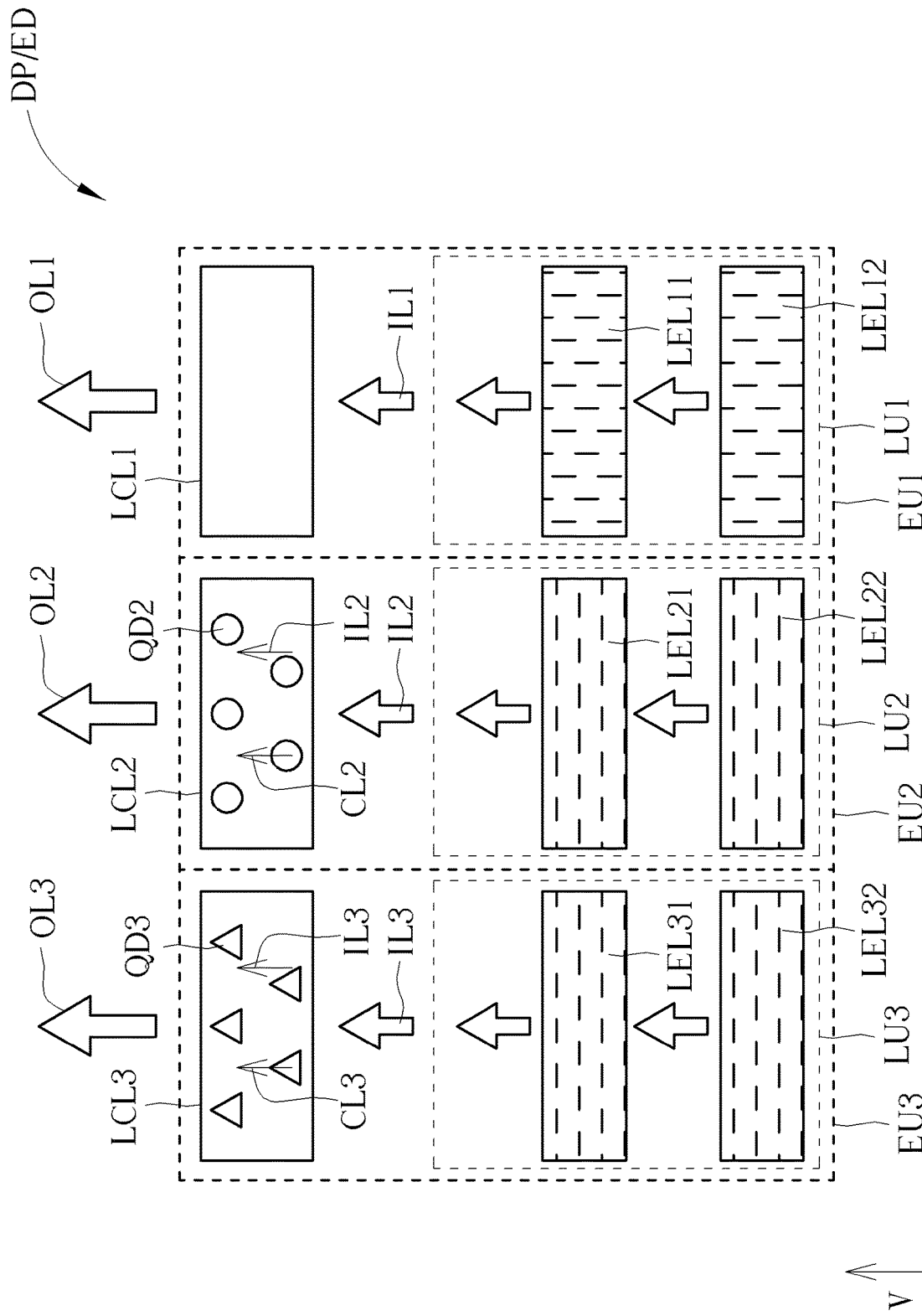
FIG. 7 is a schematic diagram illustrating an electronic device according to a fifth embodiment of the present disclosure.

FIG. 7 is a schematic diagram illustrating an electronic device according to a fifth embodiment, the first light emitting element LU1, the second light emitting element LU2, and the third light emitting element LU3 may respectively include two light emitting layers (or more than two light emitting layers). For example, a light emitting layer LEL11 and a light emitting layer LEL12 included in the first light emitting element LU1 may both emit the blue light having the main peak in the range from 461 nm to 473 nm. Therefore, the first light conversion layer LCL1 may be replaced by a transparent layer, or the first light conversion layer LCL1 is not required to be disposed. The light emitting layer LEL21 and a light emitting layer LEL22 included in the second light emitting element LU2 may both emit the blue light having the main peak in the range from 440 nm to 460 nm. The light emitting layer LEL31 and a light emitting layer LEL32 included in the third light emitting element LU3 may both emit the blue light having the main peak in the range from 440 nm to 460 nm. In some embodiments, when the number of the light emitting layers is greater than or equal to two, the light emitting layers (such as OLEDs or QLEDs) may be alternately disposed in the normal direction V.

Figure 8:
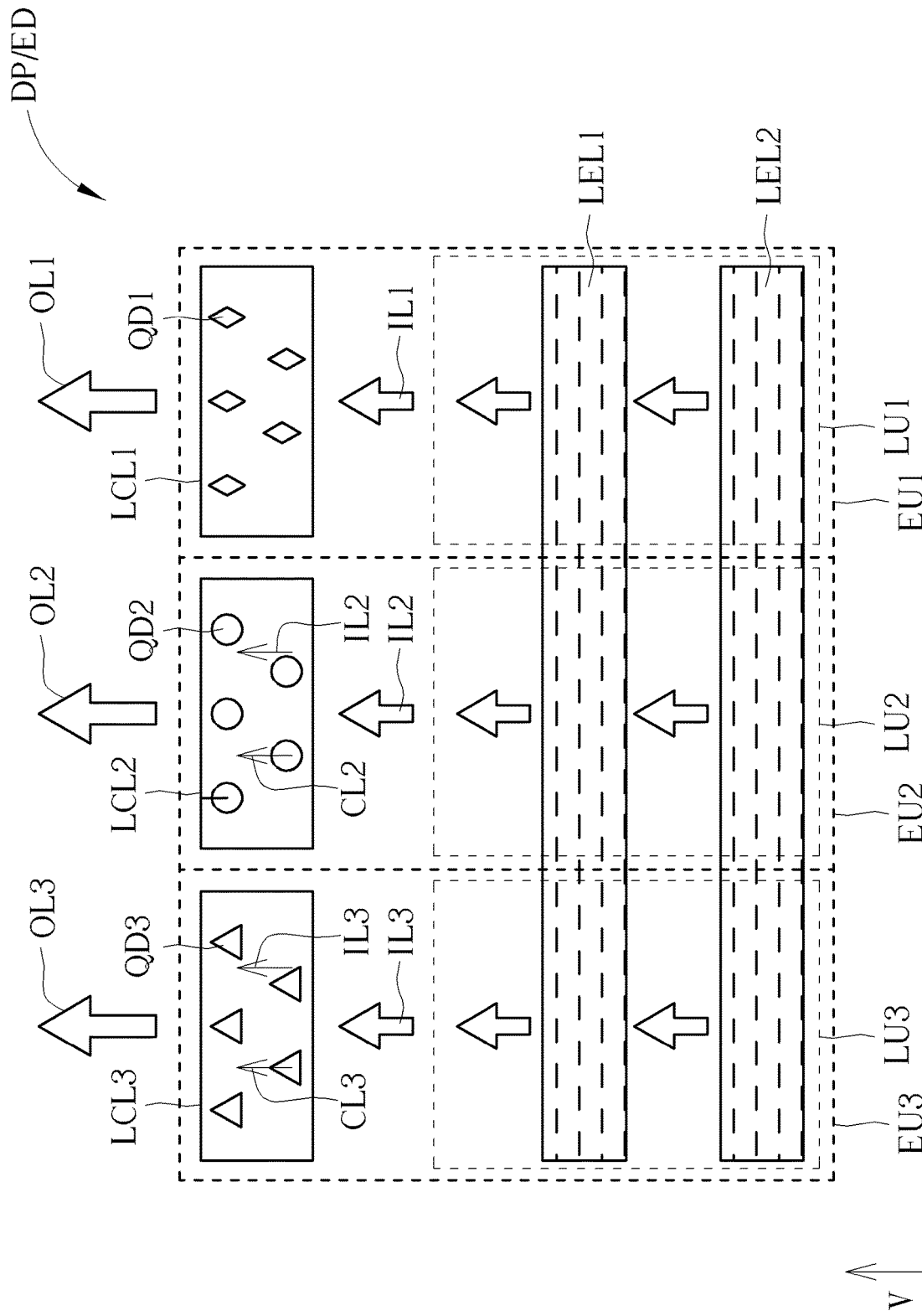
FIG. 8 is a schematic diagram illustrating an electronic device according to a sixth embodiment of the present disclosure.

FIG. 8 is a schematic diagram illustrating an electronic device according to a sixth embodiment. The difference between the sixth embodiment and the fifth embodiment is that the first light emitting element LU1, the second light emitting element LU2, and the third light emitting element LU3 share a light emitting layer LEL1 and light emitting element LEL2. The light emitting layer LEL1 and the light emitting layer LEL2 may emit the light having the main peak in the range from 440 nm to 460 nm, and the first light conversion layer LCL1 is required to be disposed in the first electronic unit EU1 to be closer to the blue primary color of the Rec. 2020 in high color gamut application.

In some embodiment, the first light emitting element LU1 comprises two light emitting layers, a hole injection layer and two hole transport layers, the hole injection layer is disposed between two the light emitting layers, wherein one of the two hole transport layers is disposed between one of two light emitting layers and the hole injection layer, and another one of two hole transport layers is disposed between another one of two light emitting layers and the hole injection layer.

Figure 9:
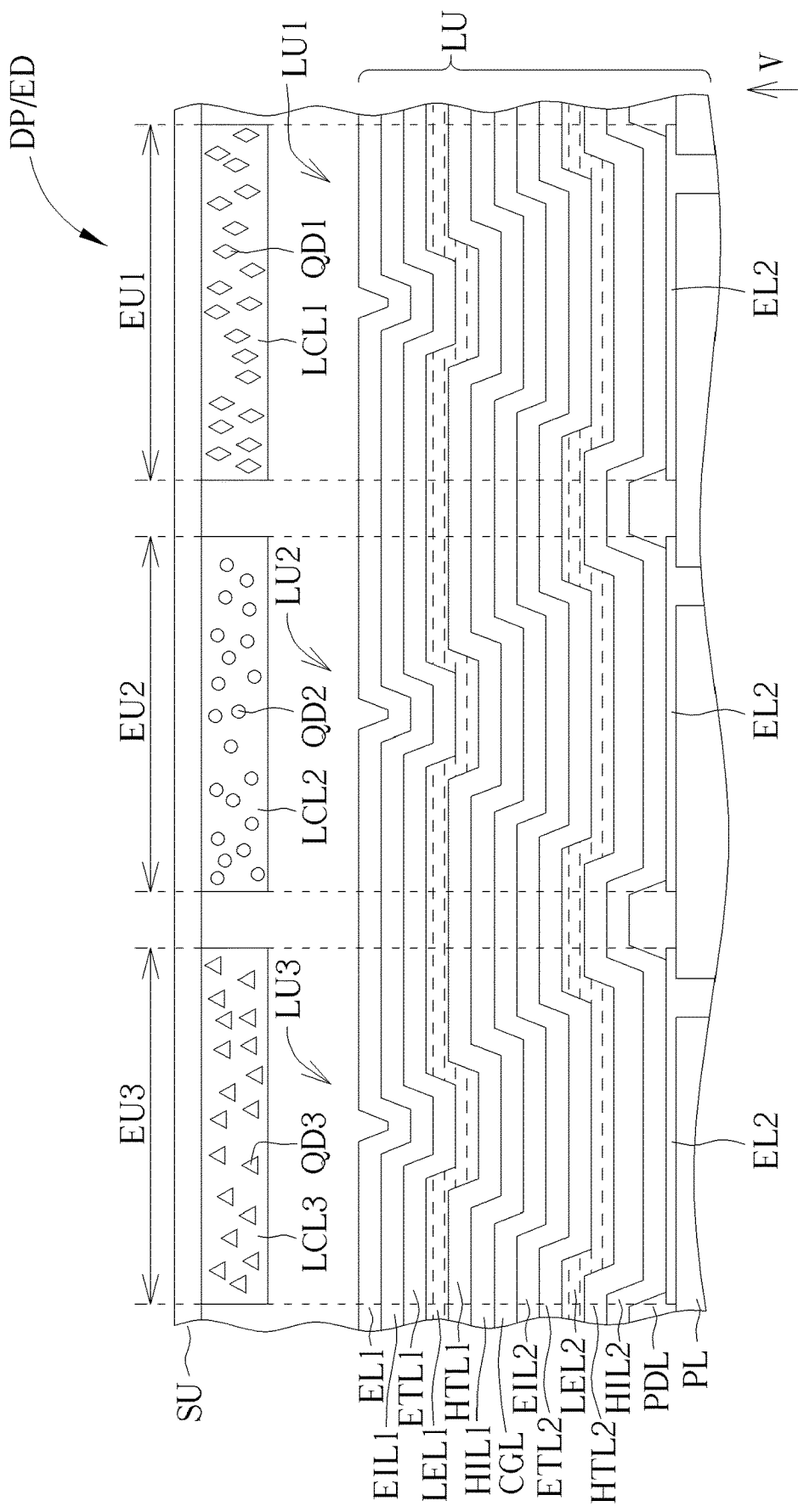
FIG. 9 is a schematic diagram illustrating a cross-sectional view of an electronic device according to a seventh embodiment of the present disclosure.

For example, FIG. 9 is a schematic diagram illustrating a cross-sectional view of an electronic device according to a seventh embodiment. The first light emitting element LU1, the second light emitting element LU2, and the third light emitting element LU3 share a common light emitting element LU. The common light emitting element LU includes a plurality of second electrodes EL2, a hole injection layer HIL2, a hole transport layer HTL2, a light emitting layer LEL2, an electron transport layer ETL2, an electron injection layer EIL2, a charge generating layer CGL, a hole injection layer HIL1, hole transport layer HTL1, a light emitting layer LEL1, an electron transport layer ETL1, an electron injection layer EIL1, a first electrode EL1 sequentially stacked in the normal direction V. The light emitting layer LEL1 and the light emitting layer LEL2 may include organic light emitting material or quantum dots. The second electrodes EL2 may be one of cathode and anode, and the first electrode EL1 may be another one of cathode and anode. The second electrodes EL2 may be disposed on a passivation layer PL, and one of the second electrodes EL2 may be disposed in the corresponding aperture formed by a pixel definition layer PDL, so the second electrodes EL2 separately is disposed in the corresponding the electronic units. Additionally, one of the second electrodes EL2 may penetrate through the passivation layer PL to be electrically connected to a transistor of the electronic unit. The light emitting layer LEL1 and the light emitting layer LEL2 may be conformally formed as the full layers, but not limited thereto. In addition, the first light conversion layer LCL1, the second light conversion layer LCL2, and the third light conversion layer LCL3 may be disposed on a substrate SU, but not limited thereto. In other embodiments, the above layers may be added or removed depending on the situation, and are not limited thereto.

The stack structure of the common light emitting element LU may be regarded as an integration of various light emitting components, wherein the light emitting components may be electrically connected in series. In some embodiments, the light emitting components may be disposed side by side laterally, the charge generating layer may not be disposed in the light emitting component, and the emitting components may be electrically connected in parallel.

Figure 10:
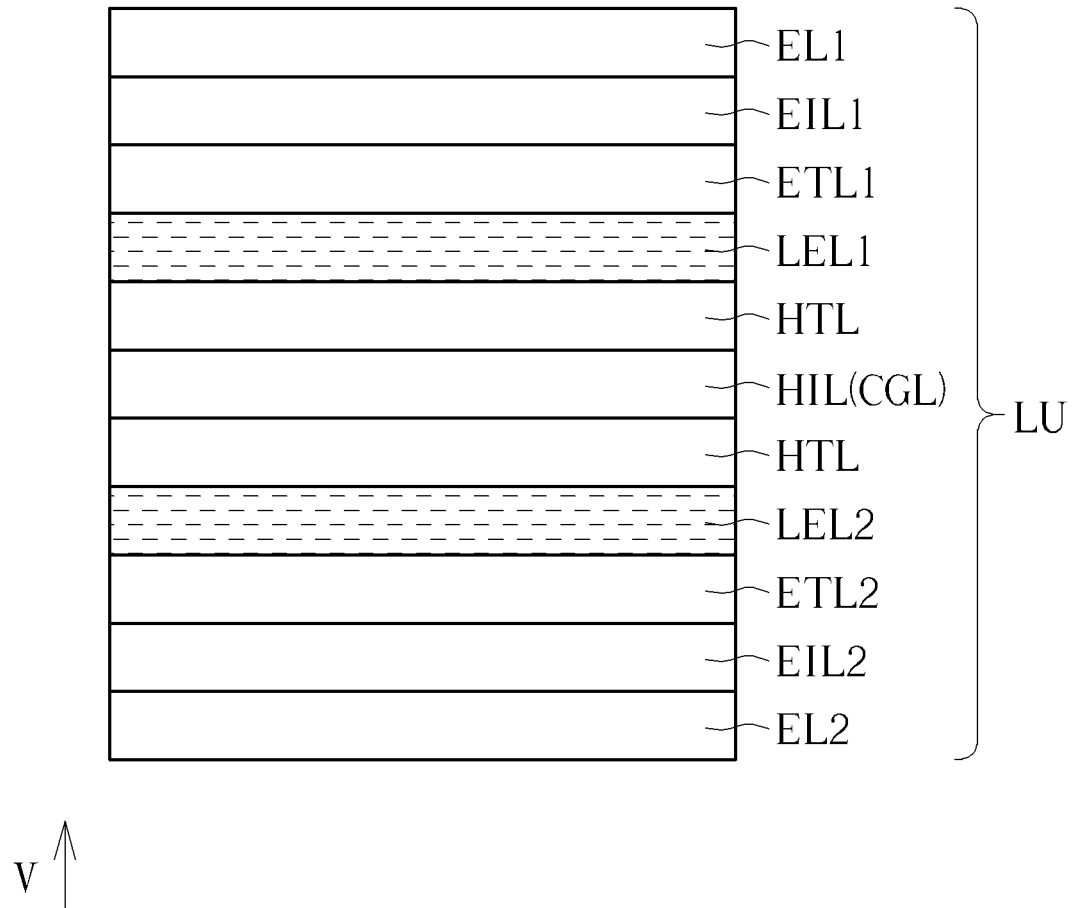
FIG. 10 is a schematic diagram illustrating a cross-sectional view of a light emitting element according to an eighth embodiment of the present disclosure.

FIG. 10 is a schematic diagram illustrating a cross-sectional view of a light emitting element according to an eighth embodiment, the difference between the eighth embodiment and the seventh embodiment is that the common light emitting element LU of the eighth embodiment includes a hole injection layer HIL, the hole injection layer HIL disposed between the light emitting layers LEL1, LEL2 can serve as the charge generating layer CGL. The common light emitting element LU includes the second electrodes EL2, the electron injection layer EIL2, the electron transport layer ETL2, the light emitting layer LEL2, hole transport layer HTL, the hole injection layer HIL, the hole transport layer HTL1, the light emitting layer LEL1, the electron transport layer ETL1, the electron injection layer EIL1, the first electrode EL1 sequentially stacked in the normal direction V. Additionally, the hole injection layer HIL may be electrically connected to an electrode that can provide the carriers to the hole injection layer HIL.

In some embodiments, the common light emitting element LU may include an electron injection layer EIL, the electron injection layer EIL disposed between the light emitting layers LEL1, LEL2 can serve as the charge generating layer CGL. The common light emitting element LU includes the second electrodes EL2, the hole injection layer HIL2, the hole transport layer HTL2, the light emitting layer LEL2, the electron transport layer ETL2, the electron injection layer EIL, the electron transport layer ETL1, the light emitting layer LEL1, the hole transport layer HTL1, the hole injection layer HIL1 sequentially stacked in the normal direction V. Additionally, the electron injection layer EIL may be electrically connected to an electrode that can provide the carriers to the electron injection layer EIL.

Figure 11:
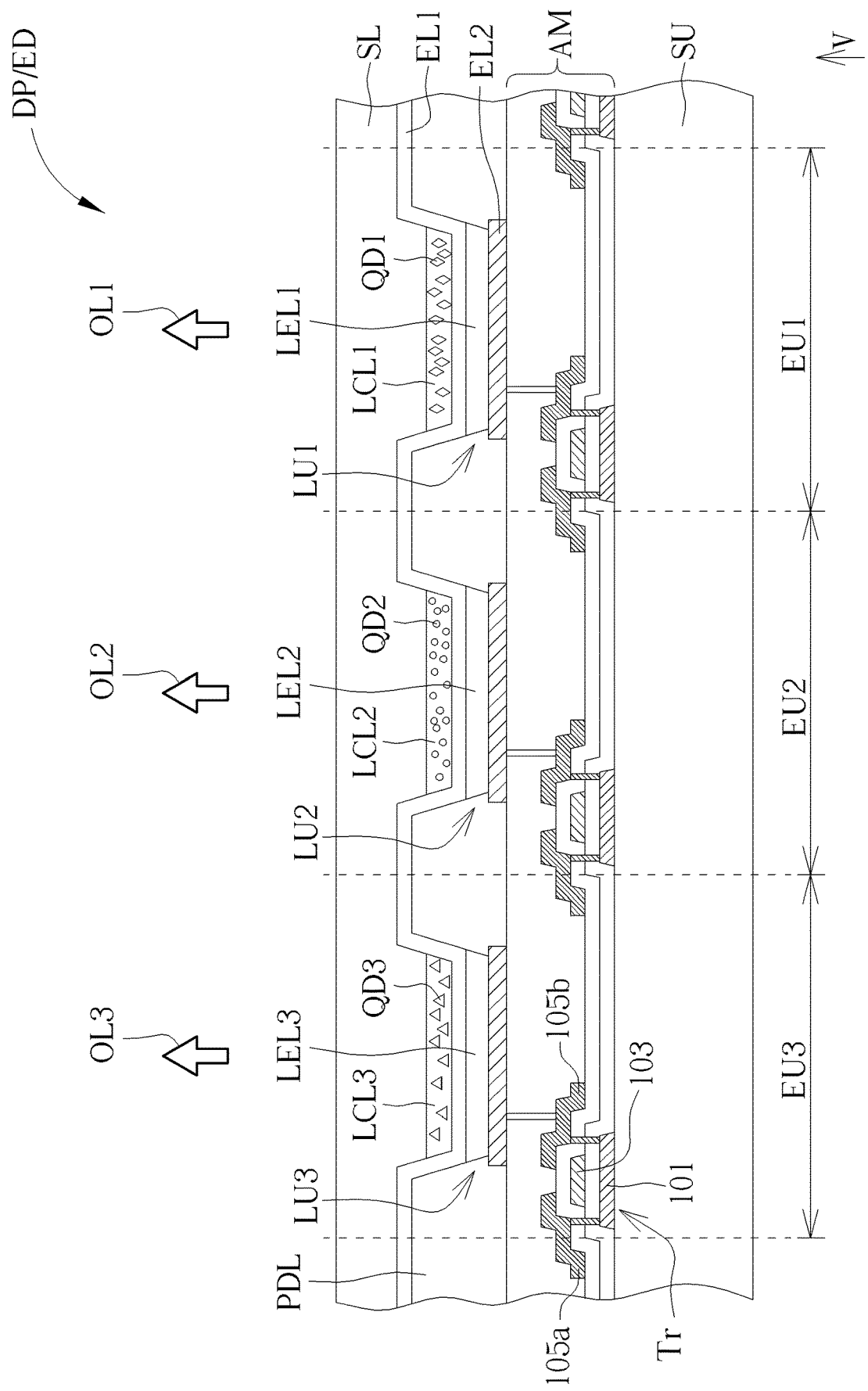
FIG. 11 is a schematic diagram illustrating a cross-sectional view of an electronic device according to a ninth embodiment of the present disclosure.

FIG. 11 is a schematic diagram illustrating a cross-sectional view of an electronic device according to a ninth embodiment, an active matrix layer AM is disposed between the light emitting elements (such as first light emitting element LU1, second light emitting element LU2, third light emitting element LU3) and the substrate SU. The pixel definition layer PDL includes a plurality of recesses. The first light emitting element LU1 and the first light conversion layer LCL1 can be disposed in one of the recesses, the second light emitting element LU2 and the second light conversion layer LCL2 can be disposed in another one of the recesses, and the third light emitting element LU3 and the third light conversion layer LCL3 can be disposed in another one of the recesses. The light emitting layers LEL1, LEL2, LEL3 are disposed between the first electrode EL1 and the second electrodes EL2.

The active matrix layer AM may include transistors Tr, signal lines, or insulating layers. The second electrodes EL2 may be electrically connected to the corresponding transistors Tr through a via. The transistor Tr may include an active layer 101, a gate electrode 103, a source electrode 105a, and a drain electrode 105b. In addition, a protective layer SL may be disposed on the light conversion layers (LCL1, LCL2, LCL3) and the first electrode EL1 to reduce the components from being exposed to moisture or oxygen.

In summary, according to the spectrums of the output lights emitted by the electronic device, the main peak of main wave of the first spectrum corresponding to the first light is in the range from 461 nm to 473 nm, the sub peaks of sub-wave of the spectrums corresponding to the second light is in the range from 300 nm to 460 nm. The wavelength difference between the main peak of the first light and the sub peak of the second light is greater than or equal to 5 nm and less than or equal to 167 nm. The difference between $B_X$ of the blue light emitted from the first electronic unit and $B_X$ of the blue primary color of the Rec. 2020 can be less than 0.004, the blue light emitted from the first electronic unit can be closer to the blue primary color of the Rec. 2020 in high color gamut application.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
   a first electronic unit emitting a blue light having a first spectrum, and the first spectrum having a first intensity, wherein the first intensity is a maximum intensity of the first spectrum; and
   a second electronic unit emitting a light having a second spectrum different from the first spectrum, and the second spectrum having a second intensity in a range from 300 nm to 460 nm, wherein the second intensity is a maximum intensity in the range from 300 nm to 460 nm of the second spectrum;
   wherein the first intensity is greater than the second intensity.

2. The electronic device of claim 1, wherein a ratio of the second intensity to the first intensity is in a range from 0.06% to 10.0%.

3. The electronic device of claim 1, wherein the first electronic unit comprises a first light conversion layer.

4. The electronic device of claim 3, wherein the first light conversion layer comprises a plurality of quantum dots, a fluorescent material, a phosphorescent material, a color filter layer or a combination thereof.

5. The electronic device of claim 1, wherein the first electronic unit further comprises a first light emitting element, and the first light conversion layer is disposed on the first light emitting element.

6. The electronic device of claim 5, further comprising a liquid crystal layer disposed between the first light emitting element and the first light conversion layer.

7. The electronic device of claim 5, wherein the first light emitting element is a backlight.

8. The electronic device of claim 1, further comprising a third electronic unit emitting a light having a third spectrum, wherein the third spectrum has a third intensity in a range from 300 nm to 460 nm, and the third intensity is a maximum intensity in the range from 300 nm to 460 nm of the third spectrum.

9. The electronic device of claim 8, wherein a ratio of the third intensity to the first intensity is in a range from 0.06% to 10.0%.

10. The electronic device of claim 8, wherein the third intensity is different from the second intensity.

11. The electronic device of claim 10, wherein the second intensity is greater than the third intensity.

12. The electronic device of claim 1, wherein the light is a red light or a green light.

13. The electronic device of claim 1, wherein the first electronic unit further comprises a first light emitting element.

14. The electronic device of claim 13, wherein the first light emitting element comprises an organic light emitting diode (OLED), a light emitting diode (LED), a mini-LED, a micro-LED, quantum dots, a quantum dot LED or combination thereof.

15. The electronic device of claim 13, wherein the first light emitting element comprises a light emitting layer, and the light emitting layer comprises an organic light emitting material.

16. The electronic device of claim 15, wherein the first light emitting element comprises a first electrode and a second electrode, and the light emitting layer is disposed between the first electrode and the second electrode.

17. The electronic device of claim 15, further comprising a pixel definition layer, wherein the pixel definition layer comprises a plurality of recesses, and the light emitting layer is disposed in one of the recesses.

18. The electronic device of claim 1, wherein the first electronic unit includes a first light emitting element, the second electronic unit includes a second light emitting element, and the first light emitting element is separated from the second light emitting element.

19. The electronic device of claim 18, further comprising a third electronic unit, wherein the third electronic unit comprises a third light emitting element, and the third light emitting element is separated from the first light emitting element and the second light emitting element.

20. The electronic device of claim 1, wherein the first electronic unit includes a first light emitting element, the second electronic unit includes a second light emitting element, and the first light emitting element contacts with the second light emitting element.

* * * * *